United States Patent
Hwang

(10) Patent No.: US 8,178,937 B2
(45) Date of Patent: May 15, 2012

(54) IMAGE SENSOR AND METHOD FOR MANUFACTURING THE SAME

(75) Inventor: Sun Jae Hwang, Seoul (KR)

(73) Assignee: Dongbu Hitek Co., Ltd., Seoul (KR)

( * ) Notice: Subject to any disclaimer, the term of this patent is extended or adjusted under 35 U.S.C. 154(b) by 436 days.

(21) Appl. No.: 12/564,219

(22) Filed: Sep. 22, 2009

(65) Prior Publication Data

US 2010/0072567 A1    Mar. 25, 2010

(30) Foreign Application Priority Data

Sep. 22, 2008    (KR) .......................... 10-2008-0092596

(51) Int. Cl.
*H01L 27/14* (2006.01)
*H01L 31/00* (2006.01)
*H01L 21/00* (2006.01)

(52) U.S. Cl. ........... 257/431; 257/E31.032; 257/E31.11; 438/57; 438/87

(58) Field of Classification Search .................. 257/431, 257/E31.032, E31.11; 438/57, 87
See application file for complete search history.

(56) References Cited

U.S. PATENT DOCUMENTS

2010/0116971 A1 * 5/2010 McCarten et al. .......... 250/214.1
2011/0260222 A1 * 10/2011 Beak et al. ..................... 257/291

FOREIGN PATENT DOCUMENTS

KR    10-2003-0057709 A    7/2003
KR    10-2004-0065335 A    7/2004

* cited by examiner

*Primary Examiner* — David S Blum
(74) *Attorney, Agent, or Firm* — Saliwanchik, Lloyd & Eisenschenk

(57) ABSTRACT

Disclosed are an image sensor and a method for manufacturing the same. The image sensor includes an isolation trench formed in a semiconductor substrate corresponding to a logic region and a pixel separating trench formed on the semiconductor substrate corresponding to a pixel region and having a depth shallower than a depth of the isolation trench of the logic region, a barrier region formed below the pixel separating trench, a pixel separator formed inside the pixel separating trench, a gate formed above the semiconductor substrate, a first doped region formed at a deep region of the semiconductor substrate corresponding to one side of the gate, an additionally-doped region interposed between the first doped region and the barrier region, and a second doped region formed at a shallow region of the semiconductor substrate such that the second doped region makes contact with the first doped region.

14 Claims, 4 Drawing Sheets

IMAGE SENSOR AND METHOD FOR MANUFACTURING THE SAME

CROSS-REFERENCE TO RELATED APPLICATION

This application claims the benefit under 35 U.S.C. §119 to Korean Patent Application No. 10-2008-0092596, filed Sep. 22, 2008, which is hereby incorporated by reference in its entirety.

BACKGROUND

An image sensor is a semiconductor device for converting optical images into electric signals, and is classified into a charge coupled device (CCD) and a complementary metal oxide semiconductor (CMOS) image sensor.

The CMOS image sensor includes a photodiode and a MOS transistor in each unit pixel, and sequentially detects the electric signals of each unit pixel in a switching mode to realize images.

The CMOS image sensor typically includes a metal interconnection layer, a passivation layer, a color filter array, a planarization layer, and a micro-lens formed on a semiconductor substrate formed with a photodiode. In such an image sensor, as a device reduces in size and becomes highly integrated, the size of a unit pixel is proportionally reduced. In addition, the size of a photodiode, which is a photo response region, may be relatively reduced.

The image sensor has a limitation where reducing a pixel size is inversely-proportional to saturation electron capacity.

BRIEF SUMMARY

Embodiments of the present invention provide an image sensor with an additionally-doped region below an STI region and a method for manufacturing the same.

According to an embodiment, an image sensor includes an isolation trench formed in a semiconductor substrate at a logic region; a pixel separating trench formed on the semiconductor substrate at a pixel region and having a depth shallower than a depth of the isolating trench of the logic region; a barrier region formed below the pixel separating trench; a pixel separator formed inside the pixel separating trench; a gate formed above the semiconductor substrate; a first doped region formed at a deep region of the semiconductor substrate at one side of the gate; an additionally-doped region interposed between the first doped region and the barrier region; and a second doped region formed at a shallow region of the semiconductor substrate such that the second doped region makes contact with the first doped region.

According to an embodiment, a method for manufacturing an image sensor includes preparing a semiconductor substrate including a pixel region and a logic region; forming an isolation trench in the logic region and a pixel separating trench in the pixel region, the pixel separating trench having a depth shallower than a depth of the device separating trench of the logic region; forming a barrier region below the pixel separating trench; forming a pixel separator in the pixel separating trench; forming a gate above the semiconductor substrate; forming a first doped region at a deep region of the semiconductor substrate at one side of the gate; forming an additionally-doped region interposed between the first doped region and the barrier region; and forming a second doped region at a shallow region of the semiconductor substrate such that the second doped region makes contact with the first doped region.

DETAILED DESCRIPTION

Hereinafter, an image sensor and a method for manufacturing the same will be described in detail with reference to accompanying drawings.

Figure 7:
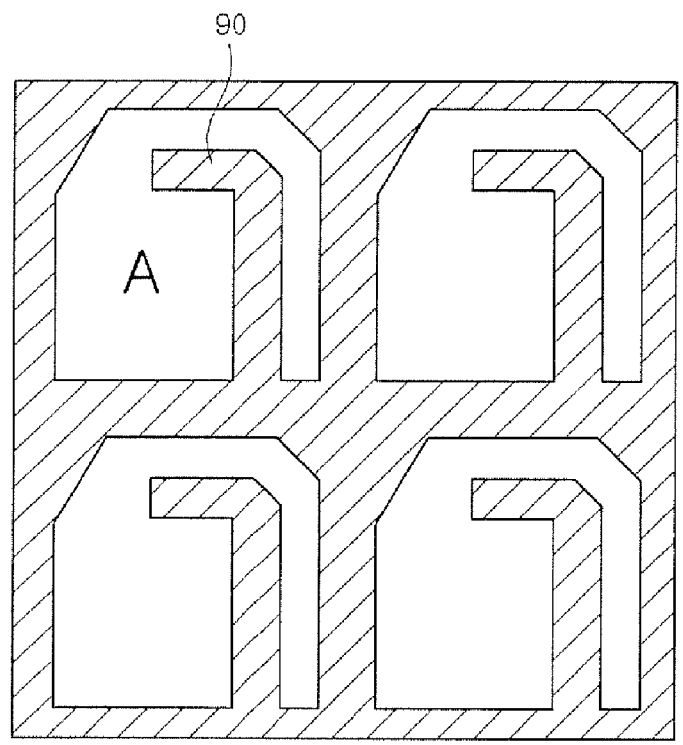
Figure 8:
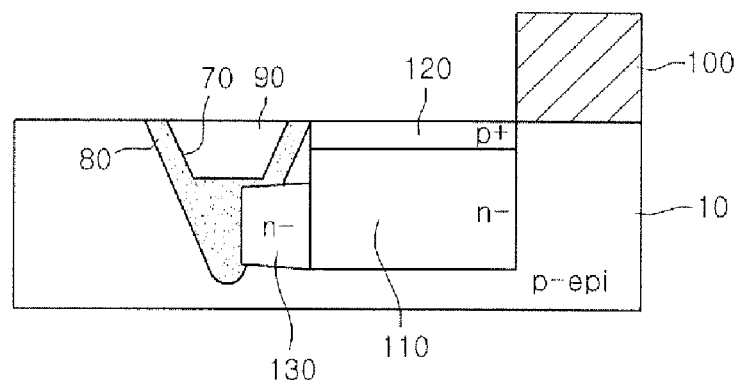

FIG. 7 is a plan view of an image sensor layout according to an embodiment and FIG. 8 is a cross-sectional view showing an image sensor according to a first embodiment.

Referring to FIGS. 7 and 8, an image sensor can include an isolation trench (not shown) formed on a semiconductor substrate 10 corresponding to a logic region, a pixel separating trench 70 formed on the semiconductor substrate 10 corresponding to a pixel region and having a depth shallower than that of the isolation trench of the logic region, a first barrier region 80 below the pixel separating trench 70, a pixel separator 90 formed inside the pixel separating trench 70, a gate 100 formed on an active region A on the semiconductor substrate 10, a first doped region 110 formed at a deep region of the semiconductor substrate 10 at one side of the gate 100, a first additionally-doped region 130 formed between the first doped region 110 and the first barrier region 80, and a second doped region 120 formed at a shallow region of the semiconductor substrate 10 such that the second doped region 120 makes contact with the first doped region 110.

The pixel separating trench 70 has a depth shallower than that of an isolation trench (not shown), and the first barrier region 80 is formed below the pixel separating trench 70 to expand the active region of the semiconductor substrate 10.

The additionally-doped region 130 is formed on the semiconductor substrate 10 corresponding to the expansion portion (larger region designated for the photodiode) of the active region A to expand a depletion region of the photodiode, so that the generation of photo charges is increased. Accordingly, a saturation electron capacity can be increased.

Reference numerals of FIG. 8 which are not described will be described below with respect to a method for manufacturing the image sensor.

Hereinafter, a method for manufacturing an image sensor according to a first embodiment will be described with reference to FIGS. 1 to 8.

Figure 1:
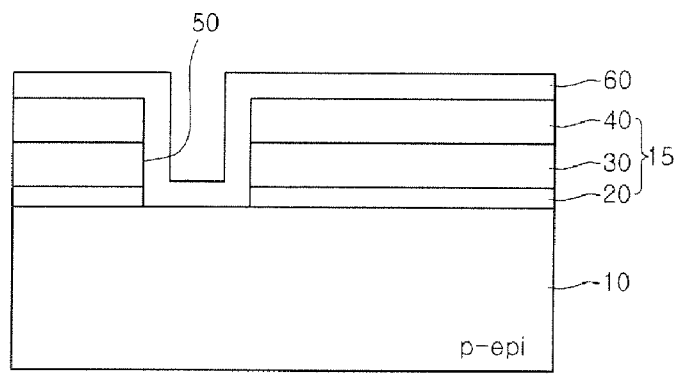
FIGS. 1 to 8 are views showing the manufacturing process of an image sensor according to a first embodiment.

Referring to FIG. 1, a first pad mask 15 and a device separating trench 50 are formed on the semiconductor substrate 10.

The semiconductor substrate 10 may be a heavily doped p-type substrate (p++), and a lightly doped p-type epitaxial layer p-epi may be formed on the semiconductor substrate 10 through an epitaxial process.

In order to form the active region and a field region on the semiconductor substrate 10, a first pad mask layer is formed. According to an embodiment, the first pad mask layer includes a pad oxide layer 20, a pad nitride layer 30, and a pad TEOS layer 40. Next, after coating a photoresist layer (not shown) on the pad TEOS layer 40, the resultant structure is exposed and developed to selectively remove the photoresist layer corresponding to the field region such that a photoresist pattern (not shown) is formed. Thereafter, the pad oxide layer 20, the pad nitride layer 30, and the pad TEOS 40 are selectively etched by using the photoresist pattern as a mask so that the device separating trench 50 and the first pad mask 15 are formed to selectively expose the surface of the semiconductor substrate 10.

The semiconductor substrate 10 exposed by the device separating trench 50 may be a region for a pixel separator. Particularly, the semiconductor substrate 10 exposed by the device separating trench 50 may be defined as a field region of the pixel region.

Next, a second pad mask layer 60 is formed on the semiconductor substrate 10 including the first pad mask 15 and the device separating trench 50. For example, the second pad mask layer 60 may be a TEOS layer having a thickness of 300 Å to 350 Å. The second pad mask layer 60 may be formed at a thin thickness along the surface of the first pad mask 15 and the device separating trench 50. In other words, the second pad mask layer 60 may be formed along a sidewall and a bottom surface of the device separating trench 50.

Figure 2:
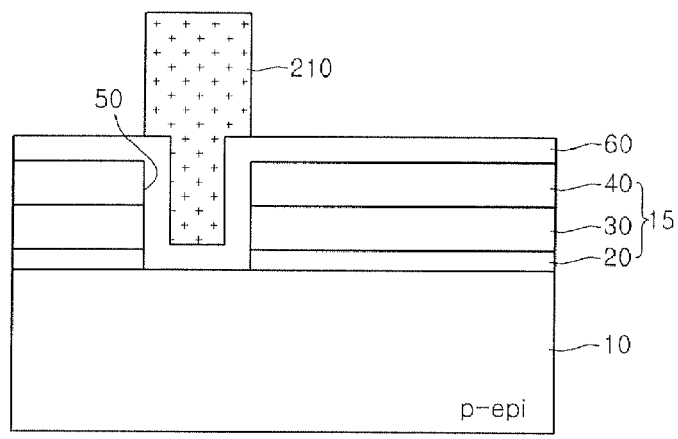

Referring to FIG. 2, a first photoresist pattern 210 is formed only covering the device separating trench 50 at regions corresponding to where the pixel separating trench will be formed. According to an embodiment, the first photoresist pattern 210 is formed only above the trench while gap-filling the inside of the trench 50 at regions corresponding to the pixel separating trench. Accordingly, the first photoresist pattern 210 covers the second pad mask layer 60 inside the trench separating trench 50. In other words, the photoresist pattern 210 can expose a remaining region of the second pad mask layer 60 except for a region of the second pad mask layer 60 corresponding to the device separating trench 50 at regions corresponding to where the pixel separating trench will be formed.

Figure 3:
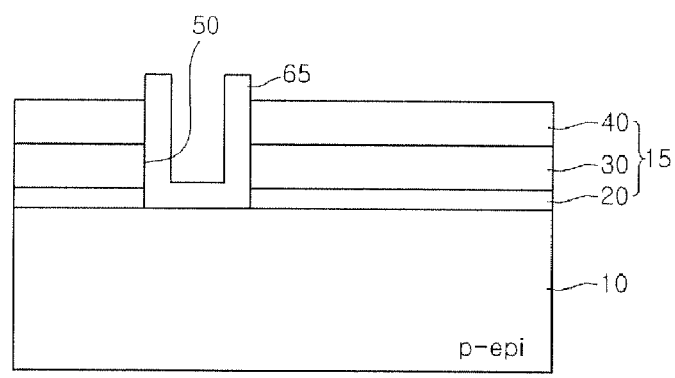

Referring to FIG. 3, a second pad mask 65 is formed inside the device separating trench 50 at regions corresponding to where the pixel separating trench will be formed. The second pad mask 65 may be formed by removing a remaining region of the second pad mask layer 60 except for the inside of the device separating trench 50 through an etching process using the first photoresist pattern 210 as an etching mask. Therefore, the second pad mask 65 is formed inside the device separating trench 50 at regions corresponding to the pixel separating trench, while the surface of the first pad mask 15 at the remaining regions and the substrate at the device separating trench in the logic region can be exposed.

Figure 4:
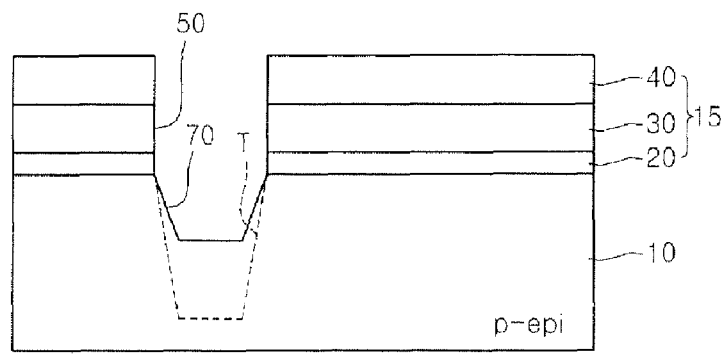

Referring to FIG. 4, the pixel separating trench 70 is formed to define the active region A on the semiconductor substrate 10. The pixel separating trench 70 may be formed by performing a reactive ion etch process for the semiconductor substrate 10 using the first and second pad masks 15 and 65 as an etch mask. When the pixel separating trench 70 is formed, since the second pad mask 65 including TEOS is formed inside the device separating trench 50 for the pixel separating trench 70, the pixel separating trench 70 may be very shallow trench. The isolation trench T corresponding to the logic region (not shown) may be formed deeper than the pixel separating trench 70 corresponding to the pixel region because the second pad mask 65 is not inhibiting the etching of the substrate in those regions.

The pixel separating trench 70 defines the active region A of the pixel region. The pixel separating trench 70 is formed through a reactive ion etch process using the second pad mask 65 as an etch mask. Accordingly, the pixel separating trench 70 is formed with a depth shallower than that of the isolation trench T of the logic region. For example, the pixel separating trench 70 of the pixel region has a depth of 1500 Å to 2500 Å, while the isolation trench T of the logic region may have a depth of 3000 Å to 4000 Å.

Since the depth of the pixel separating trench 70 corresponding to the pixel region is shallow, a lower portion of the semiconductor substrate 10 below the pixel separating trench 70 may expand to the active region A.

Figure 5:
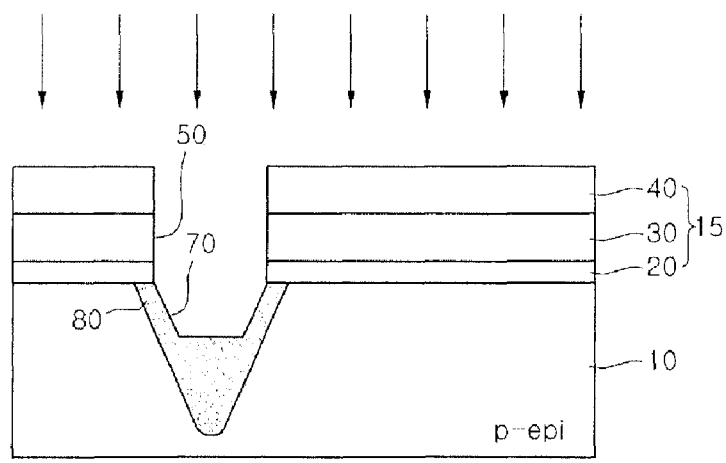

Referring to FIG. 5, the first barrier region 80 is formed around the pixel separating trench 70. The first barrier region 80 may be formed by performing an ion implantation process with respect to the pixel separating trench 70. The ion implantation process is a Channel Stop Implantation process. The ion implantation process is to recover the surface of the pixel separating trench 70 damaged by the etching process by implanting p-type impurities. For example, the first barrier region 80 may be formed by implanting BF ions.

The first barrier region 80 may be formed by implanting p-type impurities into the inside of the pixel separating trench 70 using the first pad mask 15 as an ion implantation mask. Since the pixel separating trench 70 is shallow, ions that have been implanted into the bottom surface of the pixel separating trench 70 may be deeply implanted into the inside of the semiconductor substrate 10. For example, the first barrier region 80 may have a depth identical to or deeper than that of the isolation trench T of the logic region.

In addition, the first barrier region 80 is formed through ion implantation such that the first barrier region 80 has a depth deeper than the side surface of the pixel separating trench 70. Thus, the first barrier region 80 may have an inverse triangular shape. Then, after performing a heat treatment process so that ions implanted into the pixel separating trench 70 are diffused, the first barrier region 80 is formed.

Thereafter, the first pad mask 15 may be removed through a wet or dry etching process.

Figure 6:
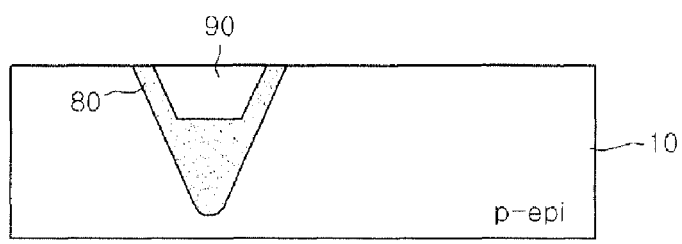

Referring to FIG. 6, an insulating layer is deposited in the pixel separating trench 70 to form the pixel separator 90. The pixel separator 90 may be formed by performing a CMP process for the semiconductor substrate 10 after depositing the insulating layer such as an oxide layer or a nitride layer.

Referring to FIGS. 6 and 7, the pixel separator 90 is formed in the form of a shallow trench inside the semiconductor substrate 10 so that the active region A can be defined in the semiconductor substrate 10.

In addition, the first barrier region 80 is deeply formed inside the semiconductor substrate 10 while surrounding the pixel separating trench 70 around the pixel separator 90 corresponding to the pixel region. Accordingly, the first barrier region 80 separates unit pixels from each other.

Since the first barrier region 80 has an inverse triangular shape, so that the edge or the first barrier region 80 is narrow, the active region A of the unit pixel can be expanded. In other words, the active region A of the unit pixel can be expanded due to the shape of the pixel separator 90 and the first barrier region 80 without increasing the size of the unit pixel.

Referring to FIG. 8, a gate 100 and a photodiode can be formed on the semiconductor substrate 10 corresponding to the unit pixel.

The gate 100 may be a gate of a transfer transistor. The gate 100 may be formed by depositing a gate insulating layer and a gate conductive layer and then patterning the resultant structure.

Next, the photodiode is formed at one side of the gate 100. The photodiode can include a first doped region 110, a second doped region 120, and a first additionally-doped region 130.

According to an embodiment, in order to form the photodiode, the first doped region 110 is formed by implanting n-type impurities into a deep region of the semiconductor substrate 10 using the gate 100 as an ion implantation mask. For example, the ion implantation process for the first doped region 110 may be performed by adjusting a tilt angle about the surface of the semiconductor substrate 10 such that the ion implantation process is achieved perpendicularly to the surface of the semiconductor substrate 10. After the first doped region 110 has been formed, the tilt angle of the ion implantation process is adjusted to about 2° to about 6°, and n-type impurities are implanted to form the first additionally-doped region 130 between the first barrier region 80 and the first doped region 110. Thereafter, the second doped region 120 may be formed in the contact with the first doped region 110 by implanting p-type impurities into a shallow region of the semiconductor substrate 10.

The first doped region 110 and the first additionally-doped region 130 are doped with n-type impurities, and the second doped region 120 is doped with p-type impurities, so that a pnp junction is achieved. Accordingly, this may be used as the photodiode.

In addition, the first additionally-doped region 130 is formed at one side of the first doped region 110 to expand an n-type impurity region. Accordingly, the depletion region of the photodiode is expanded to increase the generation rate of photo charges. This is because the first barrier region 80 doped with p-type impurities surrounds the pixel separator 90 having a shallow trench form, and has the inverse triangular shape to expand the active region of a unit pixel where the first additionally-doped region 130 is formed, thereby increasing the area of the photodiode.

Next, although not shown, after forming a floating diffusion region at the other side of the gate, a metal interconnection layer, a color filter, and a microlens can be formed.

As described above, according to an embodiment, the area of the photodiode is expanded without increasing the size of the unit pixel, so that saturation electron capacity can be increased.

In addition, the surface area of the pixel separator 90 is reduced so that a dark current characteristic can be improved.

Hereinafter, a manufacturing process of an image sensor according to a second embodiment will be described with reference to FIGS. 9 to 11. In the description about the second embodiment, the same reference numerals will be assigned to a structure and elements identical to those of the first embodiment. Here, the Channel stop implantation process of the first embodiment is not adapted to the second embodiment.

Figure 9:
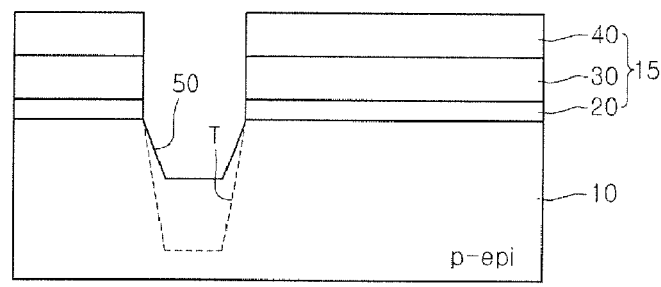
FIGS. 9 to 11 are views showing the manufacturing process of an image sensor according to a second embodiment.

Referring to FIG. 9, the pixel separating trench 70 and the first pad mask 15 are formed on the semiconductor substrate 10. The pixel separating trench 70 may have a depth shallower than that of the isolation trench T of the logic region. Since the pixel separating trench 70 is formed similarly to the first embodiment, the details thereof will be omitted.

Figure 10:
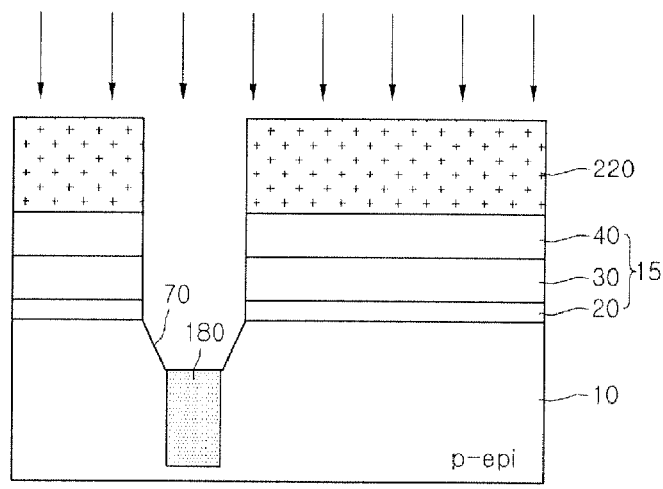

Referring to FIG. 10, a second barrier region 180 is formed in a deep region of the semiconductor substrate 10 below the bottom surface of the trench 70. The second barrier region 180 may be formed by implanting p-type impurities.

The second barrier region 180 is formed by performing an ion implantation process after a second photoresist pattern 220 is formed above the first pad mask 15 such that the pixel separating trench 70 is exposed. In an embodiment, the second barrier region 180 may be formed by implanting BF ions. The second barrier region 180 may be formed by implanting ions into the deep region of the semiconductor substrate 10 corresponding to the width of the bottom surface of the pixel separating trench 70.

As described above, the second barrier region 180 is formed with a width corresponding to the bottom surface of the pixel separating trench 70 and at a deep region of the semiconductor substrate 10, thereby separating unit pixels of the pixel region from each other.

In addition, the second barrier region 180 is formed with a narrow and long shape below the pixel separating trench 70 to expand the active region of the unit pixel.

Thereafter, an insulating layer is deposited inside the pixel separating trench 70 to form the pixel separator 190.

Figure 11:
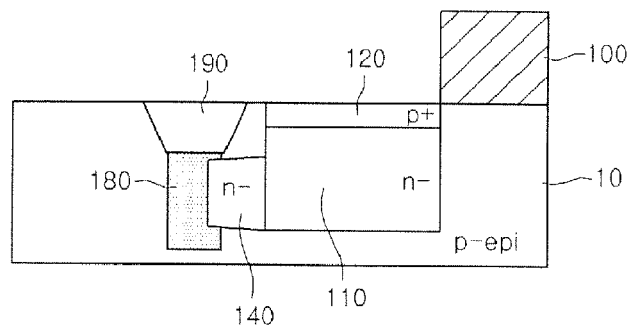

Referring to FIG. 11, a gate 100 and a photodiode are formed on the semiconductor substrate 10 corresponding to a unit pixel.

The gate 100 may be a gate of a transfer transistor. The gate 100 may be formed by depositing a gate insulating layer and a gate conductive layer and then patterning the resultant structure.

Next, the photodiode is formed at one side of the gate 100. The photodiode includes a first doped region 110, a second doped region 120, and a second additionally-doped region 140.

In order to form the photodiode, the first doped region 110 is formed by implanting n-type impurities into a deep region of the semiconductor substrate 10 using the gate 100 as an ion implantation mask. For example, the ion implantation process for the first doped region 110 may be performed by adjusting a tilt angle to a vertical angle about the surface of the semiconductor substrate 10. After the first doped region 110 has been formed, the tilt angle of the ion implantation process is adjusted to about 2° to about 6° and n-type impurities are implanted to form the second additionally-doped region 140 between the second barrier region 180 and the first doped region 110. Then, the second doped region 120 may be formed by implanting p-type impurities into a shallow region of the semiconductor substrate 10 such that the second doped region 120 makes contact with the first doped region 110.

Accordingly, the first doped region 110 and the second additionally-doped region 140 are formed by implanting n-type impurities, and the second doped region 120 is formed by implanting p-type impurities to form a pnp junction. This pnp junction can be used as a photodiode.

In addition, the second additionally-doped region 140 is formed at one side of the first doped region 110 to expand an n-type impurity region. Accordingly, the depletion region of the photodiode is expanded to increase the generation rate of photo charges. This is because the second barrier region 180 is formed below the pixel separator 190 having a shallow trench form, and formed in the narrow and long rectangular shape below the pixel separator 190 to expand the active region of a unit pixel, such that the second additionally-doped region 140 can be formed, thereby increasing the area of the photodiode of the unit pixel.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An image sensor comprising:
   an isolation trench formed in a semiconductor substrate corresponding to a logic region, and a pixel separating trench formed on the semiconductor substrate corresponding to a pixel region and having a depth shallower than a depth of the isolation trench of the logic region;
   a barrier region formed below the pixel separating trench;
   a pixel separator formed inside the pixel separating trench;
   a gate formed above the semiconductor substrate;
   a first doped region formed at a deep region of the semiconductor substrate corresponding to one side of the gate;
   an additionally-doped region interposed between the first doped region and the barrier region; and
   a second doped region formed at a shallow region of the semiconductor substrate such that the second doped region makes contact with the first doped region.

2. The image sensor of claim 1, wherein the barrier region has an inverse triangular shape such that the barrier region has an area narrowed toward a lower portion thereof while surrounding the pixel separating trench.

3. The image sensor of claim 1, wherein the barrier region is formed at a deep region of the semiconductor substrate such that the barrier region has a width corresponding to the bottom surface of the pixel separating trench.

4. The image sensor of claim 1, wherein the barrier region includes P-type impurities.

5. The image sensor of claim 1, wherein the first doped region and the additionally-doped region include N-type impurities, and the second doped region includes P-type impurities.

6. The image sensor of claim 1, wherein the additionally-doped region makes contact with the barrier region.

7. The image sensor of claim 1, wherein the additionally-doped region expands into a portion of the barrier region.

8. A method for manufacturing an image sensor, the method comprising:
   preparing a semiconductor substrate including a pixel region and a logic region;
   forming an isolation trench in the logic region and a pixel separating trench in the pixel region, the pixel separating trench having a depth shallower than a depth of the isolation trench of the logic region;
   forming a barrier region below the pixel separating trench;
   forming a pixel separator in the pixel separating trench;
   forming a gate above the semiconductor substrate;
   forming a first doped region at a deep region of the semiconductor substrate corresponding to one side of the gate;
   forming an additionally-doped region interposed between the first doped region and the barrier region; and
   forming a second doped region at a shallow region of the semiconductor substrate such that the second doped region makes contact with the first doped region.

9. The method of claim 8, wherein the forming of the pixel separating trench comprises:
   forming a first pad mask having a trench to selectively expose the semiconductor substrate;
   forming a second pad mask inside the trench; and
   forming the pixel separating trench by etching the semiconductor substrate corresponding to the trench using the first and second pad masks as an etching mask.

10. The method of claim 8, wherein the forming of the barrier region comprises implanting P-type impurities into the pixel separating trench of the semiconductor substrate such that the barrier region is formed to have an inverse triangular shape where the barrier region has an area narrowed toward a lower portion thereof while surrounding the pixel separating trench.

11. The method of claim 8, wherein the forming of the barrier region comprises:
   forming a photoresist pattern on the semiconductor substrate such that the pixel separating trench is exposed; and
   implanting P-type impurities inside the semiconductor substrate corresponding to a bottom surface of the pixel separating trench by using the photoresist pattern as an ion implantation mask,
   whereby the barrier region has a narrow and long rectangular shape with a width corresponding to the bottom surface of the pixel separating trench.

12. The method of claim 8, wherein the forming of the first doped region and the forming of the additionally-doped region comprises implanting N-type impurities into the substrate at a first angle to form the first doped region and only adjusting a tilt angle during the implanting of the N-type impurities to form the additionally doped region, and
   wherein forming the second doped region comprises implanting P-type impurities.

13. The method of claim 8, wherein the additionally-doped region makes contacts with the barrier region.

14. The method of claim 8, wherein the additionally-doped region extends to inside of the barrier region.

* * * * *